United States Patent
Schulze et al.

(10) Patent No.: US 9,035,322 B2
(45) Date of Patent: May 19, 2015

(54) SILICON CARBIDE DEVICE AND A METHOD FOR MANUFACTURING A SILICON CARBIDE DEVICE

(71) Applicant: Infineon Technologies AG, Neubiberg (DE)

(72) Inventors: Hans-Joachim Schulze, Taufkirchen (DE); Christian Hecht, Buckenhof (DE); Roland Rupp, Lauf (DE); Rudolf Elpelt, Erlangen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/850,374

(22) Filed: Mar. 26, 2013

(65) Prior Publication Data

US 2014/0291695 A1    Oct. 2, 2014

(51) Int. Cl.

| H01L 29/15 | (2006.01) |
|---|---|
| H01L 29/16 | (2006.01) |
| H01L 21/04 | (2006.01) |
| H01L 29/872 | (2006.01) |
| H01L 29/66 | (2006.01) |
| H01L 29/06 | (2006.01) |

(52) U.S. Cl.
CPC .......... *H01L 29/1608* (2013.01); *H01L 21/046* (2013.01); *H01L 29/872* (2013.01); *H01L 29/6606* (2013.01); *H01L 29/0623* (2013.01)

(58) Field of Classification Search
CPC ............ H01L 29/0638; H01L 29/1608; H01L 29/7811; H01L 29/0623; H01L 29/1095
USPC .............. 257/77, 263, 330, 472, 471, E21.09, 257/E29.313, E29.338
See application file for complete search history.

(56) References Cited

U.S. PATENT DOCUMENTS

| 5,322,802 | A |   | 6/1994 | Baliga et al. |
|---|---|---|---|---|
| 6,023,078 | A | * | 2/2000 | Baliga ........................... 257/122 |
| 6,232,625 | B1 | * | 5/2001 | Bartsch et al. ................ 257/263 |
| 6,573,128 | B1 |   | 6/2003 | Singh |
| 7,144,797 | B2 |   | 12/2006 | Chow |
| 2003/0224612 | A1 |   | 12/2003 | Merrett et al. |
| 2005/0082611 | A1 | * | 4/2005 | Peake et al. ................... 257/341 |
| 2006/0284195 | A1 |   | 12/2006 | Nagai |
| 2007/0029573 | A1 | * | 2/2007 | Cheng et al. .................. 257/135 |
| 2007/0096107 | A1 |   | 5/2007 | Brown |
| 2007/0222023 | A1 | * | 9/2007 | Schmidt ......................... 257/499 |
| 2008/0001159 | A1 | * | 1/2008 | Ota et al. ......................... 257/77 |
| 2009/0078971 | A1 | * | 3/2009 | Treu et al. ..................... 257/263 |
| 2009/0218621 | A1 | * | 9/2009 | Pfirsch et al. ................. 257/342 |
| 2014/0291697 | A1 | * | 10/2014 | Rupp et al. ....................... 257/77 |

FOREIGN PATENT DOCUMENTS

WO    9922407  A1    5/1999

OTHER PUBLICATIONS

U.S. Appl. No. 14/033,631, filed Sep. 23, 2013. 49 Pages.
U. Knipper, et al.; "Time-Periodic Avalanche Breakdown at the Edge Termination of Power Devices"; Proceedings of the 20th International Symposium on Power Semiconductor Devices and IC's; May 18-22, 2008, Orlando, Florida, p. 307-310.
Non Final Office Action Dated Sep. 8, 2014 U.S. Appl. No. 14/033,631.
Non Final Office Action Dated Mar. 19, 2015 U.S. Appl. No. 14/033,631.

* cited by examiner

*Primary Examiner* — Cuong Q Nguyen
*Assistant Examiner* — Yosef Gebreyesus
(74) *Attorney, Agent, or Firm* — Eschweiler & Associates, LLC (57) ABSTRACT

A silicon carbide device includes an epitaxial silicon carbide layer including a first conductivity type and a buried lateral silicon carbide edge termination region located within the epitaxial silicon carbide layer including a second conductivity type. The buried lateral silicon carbide edge termination region is covered by a silicon carbide surface layer including the first conductivity type.

15 Claims, 3 Drawing Sheets

FIG. 4

SILICON CARBIDE DEVICE AND A METHOD FOR MANUFACTURING A SILICON CARBIDE DEVICE

FIELD

Embodiments relate to silicon carbide technologies and in particular to a silicon carbide device and a method for manufacturing a silicon carbide device.

BACKGROUND

Silicon carbide devices comprise a high breakdown field strength, which is similarly high as the maximal tolerable field strength in thermally grown silicon dioxide, due to the large band gap. At the semiconductor surface of silicon carbide devices (e.g. at the edge termination), very high electrical fields can occur, which represent high stress at least for the passivation layers.

Therefore, an edge termination taking into account high electric fields is important for the breakdown behavior and the long-term reliability of silicon carbide devices.

SUMMARY

A silicon carbide device according to an embodiment comprises an epitaxial silicon carbide layer comprising a first conductivity type and a buried lateral silicon carbide edge termination region located within the epitaxial silicon carbide layer comprising a second conductivity type. The buried lateral silicon carbide edge termination region is covered by a silicon carbide surface layer comprising the first conductivity type.

Due to the buried lateral silicon carbide edge termination region, electrical fields occurring during the operation of the silicon carbide device can be reduced towards the edge of the silicon carbide device. Further, the buried lateral silicon carbide edge termination region can be protected from a degradation (e.g. from an oxidation) by burying the buried lateral silicon carbide edge termination region below the silicon carbide surface layer. In this way, a high temperature stability and/or moisture resistance can be achieved resulting in an improved breakdown behavior and/or an improved long-term reliability. Further, the electrical field at the surface of the silicon carbide device can be reduced due to the silicon carbide surface layer.

Some embodiments relate to a buried lateral silicon carbide edge termination region comprising a thickness so that the depletion zone of the p-n-junction of the buried lateral silicon carbide edge termination region and the silicon carbide surface layer extends at least at one point up to the surface of the silicon carbide surface layer opposite to the buried lateral silicon carbide edge termination region at least in a predefined state of the silicon carbide device. In this way, a leakage current through the silicon carbide surface layer can be avoided or can be kept low.

Some embodiments relate to a method for manufacturing a silicon carbide device comprising providing an epitaxial silicon carbide layer with a first conductivity type and manufacturing a buried lateral silicon carbide edge termination region located within the epitaxial silicon carbide layer with a second conductivity type. The buried lateral silicon carbide edge termination region is manufactured so that it is covered by a silicon carbide surface layer comprising the first conductivity type.

The proposed method enables the manufacturing of a buried edge termination. Due to the buried lateral silicon carbide edge termination region, electrical fields occurring during the operation of the silicon carbide device can be reduced towards the edge of the silicon carbide device. Further, the buried lateral silicon carbide edge termination region can be protected from a degradation (e.g. from an oxidation) by burying the buried lateral silicon carbide edge termination region below the silicon carbide surface layer. In this way, a high temperature stability and/or moisture resistance can be achieved resulting in an improved breakdown behavior and/or an improved long-term reliability. Further, the electrical field at the surface of the silicon carbide device can be reduced due to the silicon carbide surface layer.

In some embodiments, the manufacturing of the buried lateral silicon carbide edge termination region comprises implanting ions of the second conductivity type into the epitaxial silicon carbide layer through a surface region of the epitaxial silicon carbide layer representing the silicon carbide surface layer so that the buried lateral silicon carbide edge termination region is covered by the silicon carbide surface layer of the epitaxial silicon carbide layer. In this way, a buried layer can be implemented with low effort.

Some further embodiments relate to a manufacturing of the buried lateral silicon carbide edge termination region comprising implanting ions of the second conductivity type into a surface region of the epitaxial silicon carbide layer so that the buried lateral silicon carbide edge termination region is exposed at the surface of the epitaxial silicon carbide layer. Further, the silicon carbide surface layer is deposited epitaxially on top of the epitaxial silicon carbide layer so that the buried lateral silicon carbide edge termination region is covered by the silicon carbide surface layer. In this way, a smearing of the implanted ions at the edge of the buried lateral silicon carbide edge termination region into the silicon carbide surface layer can be avoided. Further, the silicon carbide surface layer can be implemented with almost arbitrary thickness. Further, the doping concentration of the silicon carbide surface layer can be selected in a wide range and independent of the doping concentration of the epitaxial silicon carbide layer comprising the buried lateral silicon carbide edge termination region.

BRIEF DESCRIPTION OF THE DRAWINGS

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
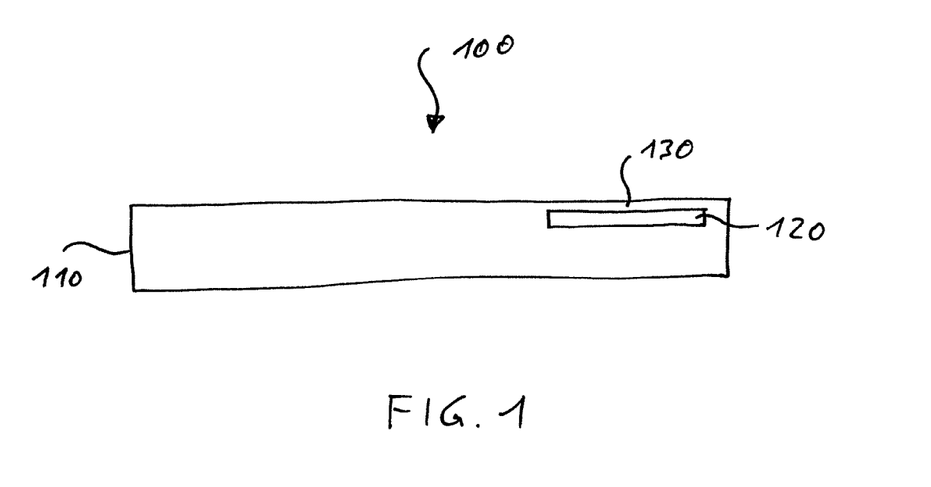
FIG. 1 shows a schematic illustration of a cross-section of a silicon carbide device.

FIG. 1 shows a schematic illustration of a cross-section of a silicon carbide device 100 according to an embodiment. The silicon carbide device 100 comprises an epitaxial silicon carbide layer 110 comprising a first conductivity type and a buried lateral silicon carbide edge termination region 120 located within the epitaxial silicon carbide layer 110 comprising a second conductivity type. Further, the buried lateral silicon carbide edge termination region 120 is covered by a silicon carbide surface layer 130 comprising the first conductivity type.

Due to the buried lateral silicon carbide edge termination region 120, the electric field in an operating state is reduced toward the edge of the silicon carbide device so that the breakdown behavior can be improved. Further, an oxidation of the buried lateral silicon carbide edge termination region 120 can be avoided by covering the buried lateral silicon carbide edge termination region 120 with a silicon carbide surface layer 130. Additionally, an oxidation of the silicon carbide surface layer 130 may be avoided. In this way, the breakdown behavior and/or the long-time reliability can be significantly improved. Further, the electrical field at the surface of the silicon carbide device can be reduced due to the silicon carbide surface layer.

The epitaxial silicon carbide layer 110 may be epitaxially grown on a silicon carbide substrate, may be bonded or attached to a carrier substrate or may be provided without a substrate.

The epitaxial silicon carbide layer 110 comprises a first conductivity type which can be a p-doping (e.g. caused by incorporating aluminum ions or boron ions during epitaxy process) or an n-doping (e.g. caused by incorporating nitrogen ions, phosphor ions or arsenic ions during epitaxy process). Consequently, the second conductivity type indicates an opposite n-doping or p-doping. In other words, the first conductivity type may indicate an n-doping and the second conductivity type may indicate a p-doping or vice-versa.

The main surface of the silicon carbide device 100 may be a surface of the silicon carbide layers of the silicon carbide device 100 towards metal layers, insulation layers or passivation layers on top of the silicon carbide layers. In comparison to a basically vertical edge surface (e.g. resulting from separating the silicon carbide device from others) of the silicon carbide device 100, the main surface of the silicon carbide device 100 may be a basically horizontal surface. The main surface of the silicon carbide device may be a basically even plane (e.g. neglecting unevenness of the silicon carbide layers due to the manufacturing process).

The lateral expansion or the extension of a layer may be the expansion in parallel to the main surface of the silicon carbide device.

In other words, the main surface of the silicon carbide device may be the interface between the silicon carbide and an insulation layer, metal layer or passivation layer on top of the silicon carbide. In comparison, the edge of the silicon carbide device 100 is basically a surface orthogonal to the main surface of the silicon carbide device.

In view of this definition, a layer of the silicon carbide device 100 may basically expand in two lateral directions and comprises a thickness measured orthogonally to the lateral directions.

The buried lateral silicon carbide edge termination region 120 is manufactured within the epitaxial silicon carbide layer 110. This region extends laterally towards the edge of the silicon carbide device 100 and represents at least one part of an edge termination structure. This region 120 is buried below the silicon carbide surface layer 130, which means that the buried lateral silicon carbide edge termination region 120 is not exposed at the main surface of the silicon carbide device, for example.

The buried lateral silicon carbide edge termination region 120 may be part of a larger implant area comprising the second conductivity type within the epitaxial silicon carbide layer 110. In other words, the buried lateral silicon carbide edge termination region 120 may be a part of an implant area which is close to the edge of the silicon carbide device (e.g. closer than 200 µm, closer than 100 µm, closer than 50 µm or closer than 20 µm, which may depend on the type of silicon carbide device or the die area occupied by the silicon carbide device). In other words, an implant area comprising the second conductivity type may be located within the epitaxial silicon carbide layer 110 which comprises a lateral end located close to an edge of the silicon carbide device covered by a silicon carbide surface layer 130. This lateral end of the implant area may represent or form the buried lateral silicon carbide edge termination region 120. Alternatively, the buried lateral silicon carbide edge termination region 120 may be a limited implant area located in the proximity of the edge of the silicon carbide device 100 (e.g. closer than 200 µm, closer than 100 µm, closer than 50 µm or closer than 20 µm, which may depend on the type of silicon carbide device, the blocking voltage of the silicon carbide device or the die area occupied by the silicon carbide device) being surrounded by silicon carbide comprising the first conductivity type.

The buried lateral silicon carbide edge termination region 120 is covered by the silicon carbide surface layer 130 so that the buried lateral silicon carbide edge termination region 120 is not exposed at the main surface of the silicon carbide device 100. In other words, the silicon carbide surface layer 130 is located on top of the buried lateral silicon carbide edge termination region 120 so that an exposure of the buried lateral silicon carbide edge termination region 120 at the main surface of the silicon carbide device 100 may be prevented.

In other words, the silicon carbide surface layer 130 may form a termination towards upper non-semiconductor layers of the silicon carbide device 100.

Optionally, additionally or alternatively to one or more aspects mentioned before, the silicon carbide surface layer may extend laterally at least from a lateral end of the buried lateral silicon carbide edge termination region 120 close to the edge of the silicon carbide device (e.g. the lateral end of the buried lateral silicon carbide edge termination region closer to the edge than the other end in a cross-section of the silicon carbide device) to an active area of the silicon carbide device, while the active area is left out by the silicon carbide surface layer 130. In other words, the silicon carbide surface layer 130 covers the buried lateral silicon carbide edge termination region 120 close to the edge of the silicon carbide device 100, but leaves the active area open so that the active area is exposed at a main surface of the silicon carbide device 100 or the silicon carbide material. In this way, the active area can be accessible for an upper metal layer, an insulation layer or a passivation layer (e.g. for implementing a metal contact and/or the wiring of the silicon carbide device).

An active area of the silicon carbide device 100 may be a central area on the die of the silicon carbide device 100 surrounded by an edge region. The active area of the silicon carbide device 100 may be an area of the silicon carbide device 100 for implementing the electrical functionality of the silicon carbide device 100. The width of the edge region may depend on the blocking voltage, the functionality and/or the die size of the silicon carbide device 100.

Further optionally, alternatively or additionally to one or more aspects mentioned above, the buried lateral silicon carbide edge termination region 120 may laterally end with a predefined distance to the edge of the silicon carbide device so that at least a lateral end located close to the edge of the silicon carbide device is surrounded by silicon carbide with the first conductivity type. In other words, an exposure of the buried lateral silicon carbide edge termination region 120 at the edge of the silicon carbide device 100 may be avoided in the lateral direction towards the edge of the silicon carbide device by implementing the buried lateral silicon carbide edge termination region 120 with a predefined lateral distance to the edge of the silicon carbide device. In this way, the buried lateral silicon carbide edge termination region 120 may be completely surrounded by the silicon carbide surface layer 130 and the epitaxial silicon carbide layer 110 so that the buried lateral silicon carbide edge termination region 120 and/or the silicon carbide surface layer 130 can be protected against environmental damages. The predefined distance to the edge of the silicon carbide device 100 may vary in dependency on the size and functionality of the silicon carbide device 100. For example, the predefined distance may be between 5 µm and 200 µm, 5 µm and 50 µm or 10 µm and 30 µm.

The buried lateral silicon carbide edge termination region 120 can be implemented or manufactured in different ways. For example, the buried lateral silicon carbide edge termination region 120 may be manufactured by a high energy implant through the surface of the epitaxial silicon carbide layer 110 (e.g. through a part of the surface of the silicon carbide device determined by an implant mask used for masking the implant) so that an implant area is formed within the epitaxial silicon carbide layer 110 in a depth and with a thickness depending on an energy distribution of the ions used for the implant. In other words, the silicon carbide surface layer 130 may be part of the epitaxial silicon carbide layer 110 (e.g. indicated in FIG. 1) and the buried lateral silicon carbide edge termination region 120 may be an implant region manufactured by implanting ions of the second conductivity type into the epitaxial silicon carbide layer 110 through a surface region of the epitaxial silicon carbide layer 110 representing the resulting silicon carbide surface layer 120. In this way, a buried lateral silicon carbide edge termination region 120 can be implemented with low effort and a low number of manufacturing steps.

Alternatively, the buried lateral silicon carbide edge termination region 120 may be manufactured by implanting ions into a surface region of the epitaxial silicon carbide layer 110 and depositing the silicon carbide surface layer 130 epitaxially on top of the epitaxial silicon carbide layer 110. The surface region may be a part of the epitaxial silicon carbide layer 110 located at the surface of the epitaxial silicon carbide layer 110. In other words, the silicon carbide surface layer 130 may be an epitaxial layer deposited on top of the epitaxial silicon carbide layer 110 with the buried lateral silicon carbide edge termination region 120. In this way, a smearing of the implant area at the edge of the buried lateral silicon carbide edge termination region 120 (e.g. due to the impact of the edge profile of the implantation mask) can be avoided and/or the thickness of the silicon carbide surface layer 130 can be varied in a large range.

Alternatively, ions of the first conductivity type may be implanted with a higher doping concentration than the buried lateral silicon carbide edge termination region 120 into the surface region of the epitaxial silicon carbide layer 110 so that the silicon carbide surface layer 130 is formed.

Optionally, additionally or alternatively to one or more aspects mentioned above, the buried lateral silicon carbide edge termination region 120 can be implemented with a variation of lateral doping. In other words, the buried lateral silicon carbide edge termination region 120 may comprise a varying lateral doping concentration. The varying doping concentration may decrease towards the edge of the silicon carbide device. The decreasing may be implemented in steps or continuously. In still other words, the buried lateral silicon carbide edge termination region 120 may comprise a first area with a first doping concentration and a second area with a second doping concentration, wherein the first area is closer to the edge of the silicon carbide device 100 than the second area and the first doping concentration is lower than the second doping concentration. In this way, the electrical field strength towards the edge of the silicon carbide device 100 can be further reduced resulting in an improved breakdown behavior and/or long-time reliability.

Optionally, alternatively or additionally to one or more aspects mentioned above, the buried lateral silicon carbide edge termination region 120 may surround the active area of the silicon carbide device (e.g. in a topside view or laterally or along the edges of the silicon carbide device). In other words, the buried lateral silicon carbide edge termination region 120 may be located within an edge region (e.g. extending 5 µm and 500 µm, between 10 µm and 500 µm, between 15 µm and 200 µm or between 50 µm and 200 µm from the edge towards a center of the silicon carbide device) of the silicon carbide device 100 surrounding the active area of the silicon carbide device 100. In this way, the electrical field strength can be kept low along the whole edge of the silicon carbide device 100. Alternatively, the buried lateral silicon carbide edge termination region 120 may only be implemented along regions of the edge comprising high electrical fields in an operating state of the silicon carbide device 100.

For example, the buried lateral silicon carbide edge termination region 120 may comprise a thickness between 200 nm and 5 µm (or between 400 nm and 2 µm, between 500 nm and 1 µm or between 600 nm and 800 nm). In other words, the thickness of the buried lateral silicon carbide edge termination region 120 can be selected within a wide range and may be fit to the desired functionality (e.g. diode, transistor) of the silicon carbide device.

The thickness of a layer may be an average thickness, since the thickness of a layer may slightly vary due to manufacturing issues, for example. For example, the thickness of the buried lateral silicon carbide edge termination region 120 may be measured between the p-n-junction towards the silicon carbide surface layer 130 and the p-n-junction at the opposite side of the buried lateral silicon carbide edge termination region 120 towards the epitaxial silicon carbide layer 110. Similarly, a thickness of the silicon carbide surface layer 130 may be measured between the p-n-junction to the buried lateral silicon carbide edge termination region 120 and the opposite (e.g. exposed) surface of the silicon carbide surface layer 130. For example, the silicon carbide surface layer comprises a thickness between 20 nm and 2 µm (or between 50 nm and 200 nm, between 50 nm and 1500 nm, between 200 nm and 1000 nm or between 600 nm and 1 µm). The thickness of the silicon carbide surface layer may be between 50 nm and 200 nm for a silicon carbide surface layer 130 resulting from a manufacturing of the buried lateral silicon carbide edge termination region 120 by implanting ions of the second conductivity type into the epitaxial silicon carbide layer through a surface region of the epitaxial silicon carbide layer 120, for example. Alternatively, the thickness of the silicon carbide surface layer 130 may be between 600 nm and 1 µm for a silicon carbide surface layer 130 manufactured by depositing an epitaxial layer on top of the epitaxial silicon carbide layer 110 comprising the buried lateral silicon carbide edge termination region 120, for example.

Optionally, additionally or alternatively to one or more aspects mentioned above, a plurality of buried lateral silicon carbide edge termination regions may be manufactured (e.g. p-rings, ring-shaped regions, point-shaped, saw-tooth-shaped, wavelike regions). In this way, the breakdown behavior and/or the long-term reliability may be improved.

Figure 2:
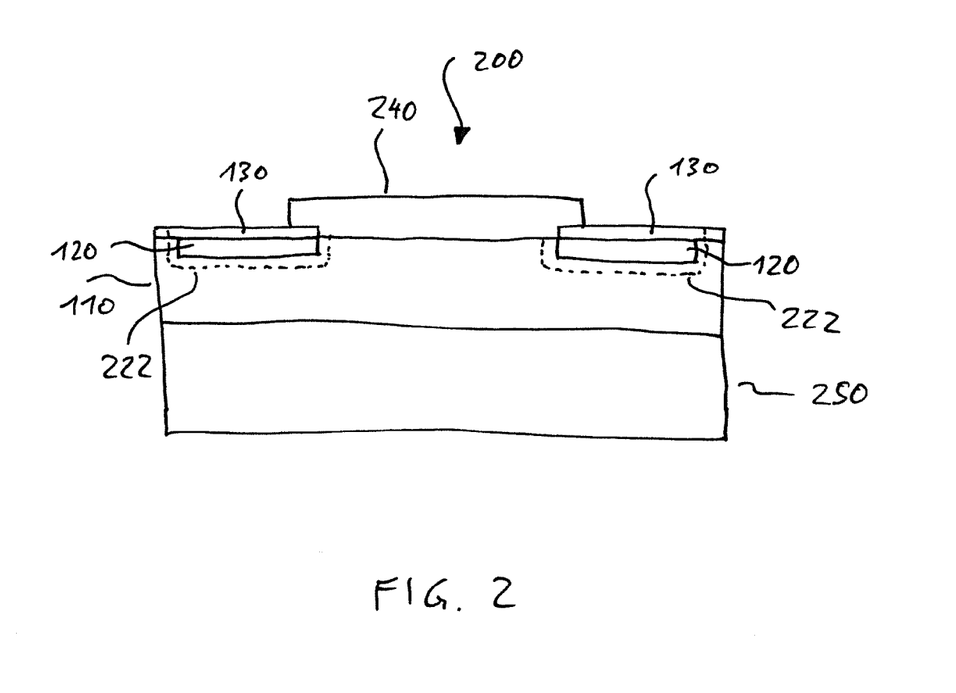
FIG. 2 shows a schematic illustration of a cross-section of a further silicon carbide device.

Optionally, additionally or alternatively to one or more aspects mentioned above, the thicknesses of the buried lateral silicon carbide edge termination region 120 and/or the silicon carbide surface layer 130 as well as the doping concentrations of the buried lateral silicon carbide edge termination region 120 and/or the silicon carbide surface layer 130 may be selected so that the silicon carbide surface layer 130 may comprise at least one region cleared from free charge carriers. Such an example is shown in FIG. 2. FIG. 2 shows the schematic illustration of a silicon carbide device 200 according to an embodiment. The silicon carbide surface layer 130 comprises a thickness and a doping concentration so that the depletion zone 222 (indicated by dotted lines) of the p-n-junction of the buried lateral silicon carbide edge termination region 120 and the silicon carbide surface layer 130 extends at least at one point up to the surface of the silicon carbide surface layer 130 opposite to the buried lateral silicon carbide edge termination region 120 (e.g. up to the main surface) in a predefined state (e.g. off state or on state of the silicon carbide device or without any electrical potential applied to the silicon carbide device or floating connections) of the silicon carbide device 200.

In this way, a leakage current through the silicon carbide surface layer 130 (e.g. between the optionally indicated metal contact 240 and the epitaxial silicon carbide layer 110 at the edge of the silicon carbide device) can be avoided or significantly reduced. Optionally, the silicon carbide surface layer 130 comprises a thickness and a doping concentration (e.g. as well as the buried lateral silicon carbide edge termination region) so that the depletion zone extends through the whole silicon carbide surface layer 130. In other words, the thicknesses and/or doping concentrations of the silicon carbide surface layer 130 and/or the buried lateral silicon carbide edge termination region 120 may be selected so that the complete silicon carbide surface layer 130 is cleared of free charge carriers (e.g. neglecting a free charge carrier density typical for a depletion zone).

For example, a sufficient expansion of the depletion zone 222 may be obtained by selecting an appropriate thickness and doping concentration of the silicon carbide surface layer 130 depending on the doping concentration of the buried lateral silicon carbide edge termination region 120. Further, a thickness of the buried lateral silicon carbide edge termination region 120 may be larger than a thickness of the silicon carbide surface layer 130, for example.

Optionally, the silicon carbide device 200 comprises a metal contact 240 on top of the active area (e.g. on top of the epitaxial silicon carbide layer) of the silicon carbide device 200 as indicated in FIG. 2. In this way, a silicon carbide Schottky diode can be implemented. In one example the epitaxial silicon carbide layer 110 and the silicon carbide surface layer 130 may comprise an n-doping and the buried lateral silicon carbide edge termination region 120 may comprise a p-doping. The buried lateral silicon carbide edge termination region 120 may surround the active area of the silicon carbide device 220 (e.g. in a top view of the silicon carbide device). Further, the silicon carbide surface layer 130 may extend from an edge of the silicon carbide device 200 along the buried lateral silicon carbide edge termination region 120 to the edge of the buried lateral silicon carbide edge termination region 120 opposite to the end at the edge of the silicon carbide device 200. Consequently, also the silicon carbide surface layer 130 surrounds the active area of the silicon carbide device 200 and leaves open the active area for the connection to the metal contact 240. In this example, the epitaxial silicon carbide layer 110 represents an n-drift layer which is arranged on top of a silicon carbide substrate 250.

Figure 3:
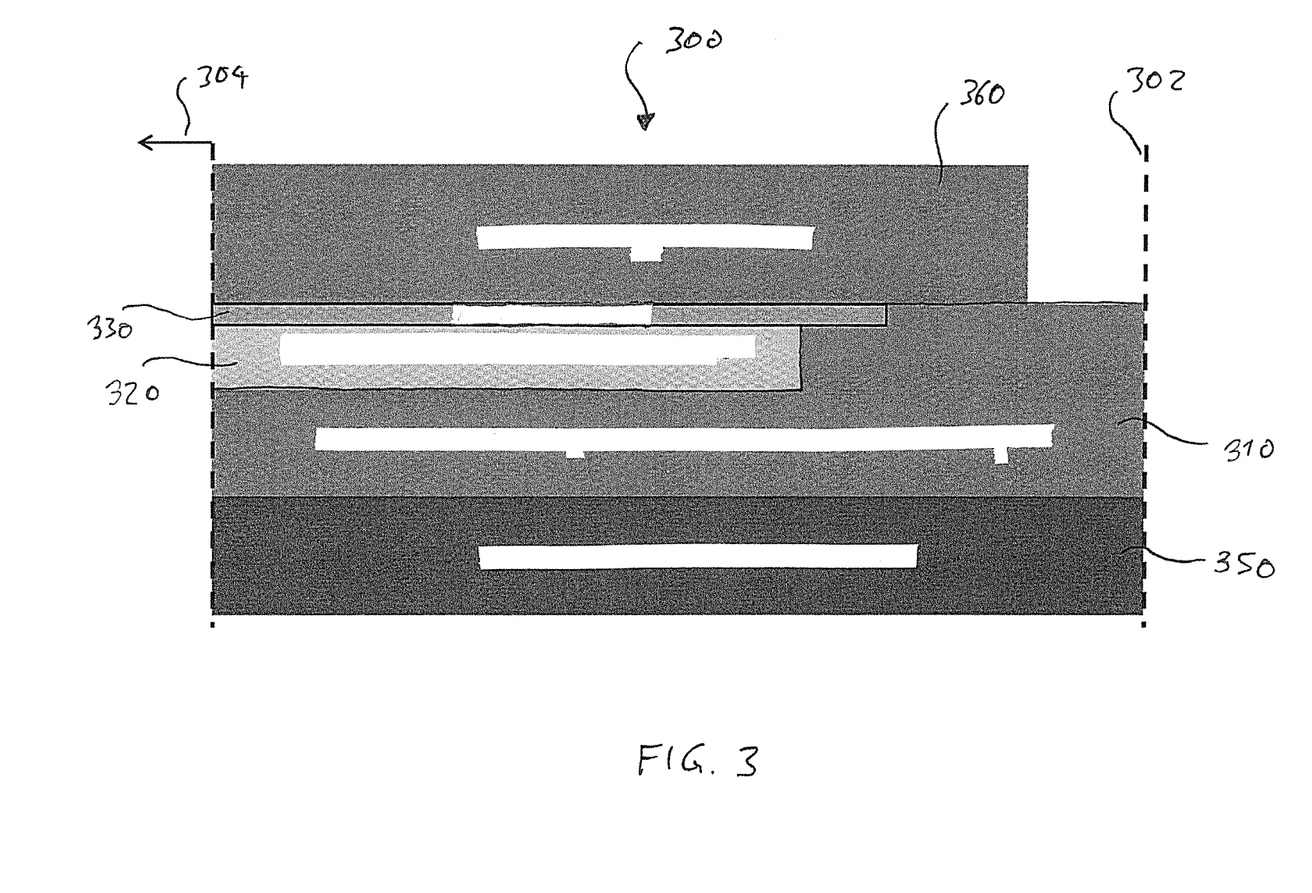
FIG. 3 shows a schematic illustration of a cross-section of an edge region of a silicon carbide device.

FIG. 3 shows a schematic illustration of a silicon carbide edge termination with a buried p-region according to an embodiment. The shown silicon carbide edge termination represents an edge region of a silicon carbide device 300. The silicon carbide device 300 comprises at least in this edge region a highly n-doped silicon carbide substrate 350 followed by an n-doped silicon carbide drift layer 310 adjusted to the particular silicon carbide device 300 (e.g. Schottky diode, merged pin Schottky diode, p-n diode, bipolar transistor, field effect transistor, metal oxide semiconductor transistor or junction gate field effect transistor) and/or the voltage class of the silicon carbide device 300. The epitaxial silicon carbide layer 310 comprises a p-doped silicon carbide region 320 for the edge termination representing a buried lateral silicon carbide edge termination region. The buried lateral silicon carbide edge termination region 320 is covered by an n-doped silicon carbide layer 330 representing a silicon carbide surface layer. The silicon carbide surface layer 330 is exposed at the main surface of the silicon carbide device 300. A passivation layer 360 is implemented on top of the silicon carbide surface layer 330. The buried lateral silicon carbide edge termination region 320 laterally ends with a predefined distance to the edge 302 of the silicon carbide device 300. The buried lateral silicon carbide edge termination region 320 may be part of a larger implant area extending further towards the active chip area 304 (or active area of the silicon carbide device). The silicon carbide surface layer 330 laterally ends with a predefined distance (e.g. less than the predefined distance of the buried lateral silicon carbide edge termination region) to the edge 302 of the silicon carbide devices 300, extends to the edge 302 of the silicon carbide device or ends at the same predefined distance to the edge 302 of the silicon carbide device 300 as the buried lateral silicon carbide edge termination region 320. In this example, the buried lateral silicon carbide edge termination region 320 comprises a larger thickness than the silicon carbide surface layer 330.

The edge termination shown in FIG. 3 may comprise one or more optional, additional features corresponding to one or more aspects mentioned above.

Some embodiments relate to a silicon carbide device comprising an n-doping and a buried lateral silicon carbide edge termination region located within the epitaxial silicon carbide layer comprising a p-doping. The buried lateral silicon carbide edge termination region is covered by a silicon carbide surface layer comprising an n-doping. The buried lateral silicon carbide edge termination region comprises a thickness between 600 nm and 800 nm and the silicon carbide surface layer comprises a thickness between 50 nm and 200 nm or between 600 nm and 1 µm.

The silicon carbide device may comprise one or more additional optional features corresponding to one or more aspects described above.

In some embodiments, the silicon carbide device comprises a Schottky diode, a merge pin Schottky diode, a p-n diode, a bipolar transistor, a field effect transistor, a metal oxide semiconductor transistor or a junction gate field effect transistor. In other words, the silicon carbide device may be a Schottky diode, a merge pin Schottky diode, a p-n diode, a bipolar transistor, a field effect transistor, a metal oxide semiconductor transistor or a junction gate field effect transistor or an electrical circuit comprising one or more of these elements.

Figure 4:
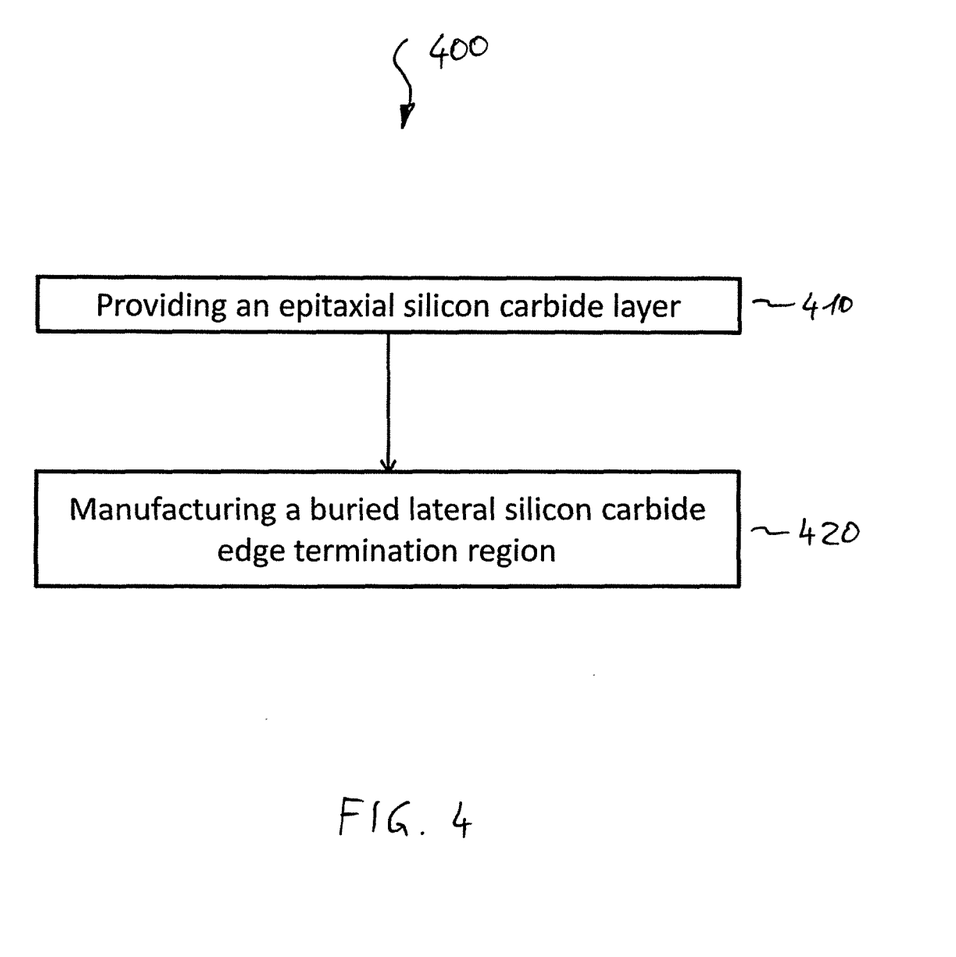
FIG. 4 shows a flowchart of a method for manufacturing a silicon carbide device.

FIG. 4 shows a flow diagram of a method 400 for manufacturing a silicon carbide device according to an embodiment. The method 400 comprises providing an epitaxial silicon carbide layer comprising a first conductivity type at 410 and manufacturing a buried lateral silicon carbide edge termination region comprising a second conductivity type and being located within the epitaxial silicon carbide layer at 420. The buried lateral silicon carbide edge termination region is manufactured at 420 so that it is covered by a silicon carbide surface layer comprising the first conductivity type.

In this way, a silicon carbide device with the properties and characteristics mentioned above can be manufactured with low effort.

The providing of the epitaxial silicon carbide layer at 410 may comprise supplying the layer as the semiconductor material or may comprise manufacturing the epitaxial silicon carbide layer (e.g. on top of a silicon carbide substrate).

The buried lateral silicon carbide edge termination region below the silicon carbide surface layer may be manufactured at 420 in different ways. For example, the manufacturing of the buried lateral silicon carbide edge termination region at 420 may comprise implanting ions of the second conductivity type into the epitaxial silicon carbide layer through a surface region of the epitaxial silicon carbide layer (e.g. through a part of the surface of the silicon carbide device determined by an implant mask used for masking the implant) representing the silicon carbide surface layer so that the buried lateral silicon carbide edge termination region is covered by the silicon carbide surface layer of the epitaxial silicon carbide layer. In other words, the buried lateral silicon carbide edge termination region may be manufactured by a high-energy ion implant into the depth of the epitaxial silicon carbide layer so that a thin epitaxial silicon carbide layer comprising the first conductivity type remains on top of the implant region. This remaining layer forms the silicon carbide surface layer. For example, ions with an average energy of more than 50 keV, more than 100 keV or more than 200 keV may be used for manufacturing the buried lateral silicon carbide edge termination region within the epitaxial silicon carbide layer. Further, the energy distribution of the ions can be selected so that the doping concentration varies with the depth in a predefined manner. For example, the doping concentration may increase with the depth to a maximum and may decrease afterwards. Alternatively, the basically constant doping concentration may be manufactured (e.g. neglecting edge effects and neglecting deviation of less than 20%, 10% or 5%) resulting basically a box or rectangular distribution.

Further, optionally, the thickness of the silicon carbide surface layer can be increased by depositing silicon carbide on the silicon carbide surface layer (e.g. by epitaxy).

Alternatively, the buried lateral silicon carbide edge termination region may be manufactured by implanting ions of the second conductivity type into a surface region of the epitaxial silicon carbide layer so that the buried lateral silicon carbide edge termination layer is exposed at the surface of the epitaxial silicon carbide layer. Further, the silicon carbide surface layer may be deposited epitaxially on top of the epitaxial silicon carbide layer so that the buried lateral silicon carbide edge termination region is covered by the silicon carbide surface layer. In other words, the buried lateral silicon carbide edge termination region may be implanted with low energy ions resulting in an implant area located at or near the surface of the epitaxial silicon carbide layer. Afterwards, the buried lateral silicon carbide edge termination region is buried by depositing the silicon carbide surface layer.

In this way, a smearing of the implanted ions at the edge of the buried lateral silicon carbide edge termination region into the silicon carbide surface layer can be avoided. Further, the silicon carbide surface layer can be implemented with almost arbitrary thickness. Further, the doping concentration of the silicon carbide surface layer can be selected in a wide range and independent of the doping concentration of the epitaxial silicon carbide layer comprising the buried lateral silicon carbide edge termination region.

Alternatively to the deposition of the silicon carbide surface layer on top of the epitaxial silicon carbide layer, ions with the first conductivity type can be implanted with lower energy (e.g. average or maximal energy) than the buried lateral silicon carbide edge termination region so that a thin layer exposed at the surface of the epitaxial silicon carbide layer is converted to the silicon carbide surface layer comprising the first conductivity type. In other words, after implanting ions of the second conductivity type into a deep surface region (e.g. compared to a surface region of the silicon carbide surface layer) of the epitaxial silicon carbide layer, ions of the first conductivity type can be implanted into a shallow surface region (e.g. thinner than the deep surface region of the buried lateral silicon carbide edge termination region) of the epitaxial silicon carbide layer so that the silicon carbide surface layer is obtained on top of the buried lateral silicon carbide edge termination region, wherein the ions are implanted in the shallow surface region with a doping concentration higher than a (e.g. maximal or average) doping concentration of the buried lateral silicon carbide edge termination region in the shallow surface region before the implant of the ions. In this way, a buried edge termination region can be obtained without an additional epitaxial process. Therefore, a reliable edge termination can be obtained with low effort.

Optionally, alternatively or additionally, the doping concentration within the silicon carbide surface layer can be increased by a further implant. In other words, the method 400 may further comprise implanting ions of the first conductivity type into the silicon carbide surface layer so that the silicon carbide surface layer comprises a higher doping concentration than the epitaxial silicon carbide layer. In this way, the doping concentration of the silicon carbide surface layer can be selected in a wide range.

Optionally, alternatively or additionally, the method 400 may further comprise removing the silicon carbide surface layer (e.g. if it is deposited throughout the whole surface of the silicon carbide device) at an active area of the silicon carbide device. In this way, the active area may be accessible for further implants for electrical structures used for the electrical functionality of the silicon carbide device or for connecting one or more areas within the active area of the silicon carbide device to a metal contact or a metal layer above or on top of the silicon carbide die.

The proposed method may be used for manufacturing all kinds of semiconductor devices mentioned above. Consequently, the aspects and details mentioned above are applicable or implementable in connection with the method for manufacturing such a silicon carbide device.

Further, the method 400 may comprise one or more optional, additional or alternative acts corresponding to one or more aspects mentioned above.

Some embodiments relate to an edge termination for silicon carbide devices (SiC devices) by implementing buried junction termination extensions by high-energy ion implantation or n-epitaxy. In this way, an H2O-rugged SiC chip (water rugged silicon carbide device) can be provided. In other words, a moisture-resisting edge termination for silicon carbide power semiconductor devices can be provided, for example.

In comparison to silicon carbide edge terminations which are based on the principle of bipolar junction terminations or variation of lateral doping, a degradation of the p-doped silicon carbide region at the interface to the passivation layer subject to certain conditions (e.g. high moisture or temperature variation) and normal electrical load can be avoided by the described concept. Especially a degradation which occurs by an oxidation of the silicon carbide in the p-doped edge region (anodic oxidation) can be avoided. In this way, the doping amount inserted at the edge for the electric field control can be protected from being consumed (by the oxidation) which may result in a destructive breakdown at voltages below the nominal voltage of the device. Also the risk of a crack formation, a low tightness against water, a critical process compatibility and/or vulnerability to the integration of mobile ions resulting in a breakdown voltage drift as it may occur in connection with oxide or nitride coating can be reduced or avoided by using the proposed concept.

The edge termination of such silicon carbide devices can be configured so that an n-doped region is formed at the surface of the edge termination (e.g. especially in the region, in which an increased electrical field strength occurs) to avoid the mentioned degradation effects.

For example, a possible method is the dimensioning of a bipolar junction termination so that the used p-doped region is buried below the silicon carbide surface. Especially at silicon carbide based devices, this can be implemented by implanting the atoms operative as acceptors with an implant energy that causes an end of range which is located at a sufficient distance to the surface. The proposed scheme can easily be implemented since the dopants possible as acceptors virtually do not diffuse in silicon carbide. In comparison, for example silicon comprises a high diffusion constant for possible acceptor materials.

The implantation energies may lie above 50 keV, above 100 keV or above 200 keV, for example. Also an implementation with several energies and different doses may be possible for such an edge termination to improve the effectivity. For example, the dose may first increase with depth and then decrease again. Alternatively, the dose may also decrease with depth.

An embodiment is shown in FIG. 3. Instead of a bipolar junction termination-edge termination, also a variation of lateral doping edge termination may be used (additionally to the proposed concept) that implements either a continuous decrease of the p-doping or a stepped decrease of the p-doping in the lateral direction. Alternatively, a similar variation of lateral doping can be achieved by manufacturing a plurality of buried lateral silicon carbide edge termination regions (e.g. p-rings, ring-shaped regions, point-shaped, saw-tooth-shaped, wavelike regions).

Further, additional implants with dopants operative as donors may be implemented to increase the near-surface n-doping, which may otherwise be determined by the epitaxial layer required for the device. In this connection, the penetration of the donors may be significantly lower than the penetration of the acceptors due to an appropriate selection of the implantation energy. Alternatively, a thin n-doped epitaxial layer may be deposited on top of the epitaxial silicon carbide wafer used for the specific device which comprises the drift layer doping at the surface, since basically no diffusion may occur under the usual high temperature steps. The thickness and the doping of this epitaxial layer may be assessed so that an appropriate n-doped layer remains between the buried p-doped region and the semiconductor surface to enable the desired avoidance of degradation effects on the one hand and to allow an over-doping of the p-regions in the active area of the chip to be realized later on (used for implementing the main electrical functionality of the silicon carbide device) on the other hand. Optionally, this additional epitaxial layer in the active region of the chip can be etched back so that it only remains in the edge region.

In embodiments, the n-doped surface layer may be assessed so that the charge carriers of these layers are at least locally cleared in so far as the resulting cross-conductivity of this layer contributes only a negligible leakage current in a cutoff case or cutoff state of the silicon carbide device.

The proposed edge termination may be based on a p-doped region buried within an n-doped silicon carbide semiconductor. In this way, corresponding structures as well as corresponding methods (for manufacturing) can be implemented. Such structures may avoid that p-doped silicon carbide is a surface part directly exposed to possible oxidation in the region of high surface field strengths.

Embodiments may further provide a computer program having a program code for performing one of the above methods, when the computer program is executed on a computer or processor. A person of skill in the art would readily recognize that steps of various above-described methods may be performed by programmed computers. Herein, some embodiments are also intended to cover program storage devices, e.g., digital data storage media, which are machine or computer readable and encode machine-executable or computer-executable programs of instructions, wherein the instructions perform some or all of the steps of said above-described methods. The program storage devices may be, e.g., digital memories, magnetic storage media such as magnetic disks and magnetic tapes, hard drives, or optically readable digital data storage media. The embodiments are also intended to cover computers programmed to perform the acts of the above-described methods or (field) programmable logic arrays ((F)PLAs) or (field) programmable gate arrays ((F) PGAs), programmed to perform said steps of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is adapted for performing a certain function, respectively. Hence, a "means for s.th." may as well be understood as a "means being adapted or suited for s.th.". A means being adapted for performing a certain function does, hence, not imply that such means necessarily is performing said function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A silicon carbide device comprising:
   a silicon carbide layer comprising a first conductivity type; and
   a buried lateral silicon carbide edge termination region located within the silicon carbide layer comprising a second conductivity type,
   wherein the buried lateral silicon carbide edge termination region is covered by a silicon carbide surface layer comprising the first conductivity type,
   wherein the silicon carbide surface layer comprises a thickness and a doping concentration, so that a depletion zone of a p-n-junction formed between the buried lateral silicon carbide edge termination region and the silicon carbide surface layer extends at least at one point up to a surface of the silicon carbide surface layer opposite to the buried lateral silicon carbide edge termination region at least in a predefined state of the silicon carbide device.

2. The silicon carbide device according to claim 1, wherein the depletion zone extends through an entirety of the silicon carbide surface layer.

3. The silicon carbide device according to claim 1, wherein a thickness of the buried lateral silicon carbide edge termination region is larger than a thickness of the silicon carbide surface layer.

4. The silicon carbide device according to claim 1, wherein the buried lateral silicon carbide edge termination region comprises a thickness between 200 nm and 5 µm.

5. The silicon carbide device according to claim 1, wherein the silicon carbide surface layer comprises a thickness between 20 nm and 2 µm.

6. The silicon carbide device according to claim 1, wherein the first conductivity type is an n-doping and the second conductivity type is a p-doping.

7. The silicon carbide device according to claim 1, wherein the silicon carbide surface layer is part of the silicon carbide layer, wherein the buried lateral silicon carbide edge termination region is an implant region manufactured by implanting ions of the second conductivity type into the silicon carbide layer through a surface region of the epitaxial silicon carbide layer representing the silicon carbide surface layer.

8. The silicon carbide device according to claim 1, wherein the silicon carbide surface layer is an layer deposited on top of the silicon carbide layer comprising the buried lateral silicon carbide edge termination region.

9. The silicon carbide device according to claim 1, wherein the buried lateral silicon carbide edge termination region comprises a varying lateral doping concentration, wherein the doping concentration decreases towards an edge of the silicon carbide device.

10. The silicon carbide device according to claim 1, wherein the silicon carbide surface layer comprises a higher doping concentration than the silicon carbide layer.

11. The silicon carbide device according to claim 1, wherein the silicon carbide surface layer extends laterally from a lateral end of the buried lateral silicon carbide edge termination region close to an edge of the silicon carbide device to an active area of the silicon carbide device, while the active area is left out by the silicon carbide surface layer.

12. The silicon carbide device according to claim 1, wherein the buried lateral silicon carbide edge termination region laterally ends at a predefined distance from an edge of the silicon carbide device, so that at least a lateral end of the buried lateral silicon carbide edge termination region located close to the edge of the silicon carbide device is surrounded by silicon carbide of the first conductivity type.

13. The silicon carbide device according to claim 1, wherein the buried lateral silicon carbide edge termination region surrounds an active area of the silicon carbide device.

14. The silicon carbide device according to claim 1, wherein the silicon carbide device comprises a Schottky diode, a merged pin Schottky diode, a p-n-diode, a bipolar transistor, a field effect transistor, a metal oxide semiconductor transistor or a junction gate field effect transistor.

15. A silicon carbide device comprising:
an silicon carbide layer comprising a first conductivity type; and
a buried lateral silicon carbide edge termination region located within the epitaxial silicon carbide layer comprising a second conductivity type,
wherein the buried lateral silicon carbide edge termination region is covered by a silicon carbide surface layer comprising the first conductivity type,
wherein a thickness of the buried lateral silicon carbide edge termination region is larger than a thickness of the silicon carbide surface layer.

\* \* \* \* \*

UNITED STATES PATENT AND TRADEMARK OFFICE
CERTIFICATE OF CORRECTION

| | | |
|---|---|---|
| PATENT NO. | : 9,035,322 B2 | Page 1 of 1 |
| APPLICATION NO. | : 13/850374 | |
| DATED | : May 19, 2015 | |
| INVENTOR(S) | : Hans-Joachim Schulze et al. | |

It is certified that error appears in the above-identified patent and that said Letters Patent is hereby corrected as shown below:

In the Claims,

Column 14, Claim 7, Line 62 Please replace "…region of the cpitaxial silicon" with --…region of the silicon--

Signed and Sealed this
Fifteenth Day of September, 2015

Michelle K. Lee
*Director of the United States Patent and Trademark Office*